(12) United States Patent
Steffka et al.

(10) Patent No.: US 10,434,963 B2
(45) Date of Patent: Oct. 8, 2019

(54) POWER DISTRIBUTION BOX ASSEMBLY WITH ALIGNMENT FEATURES

(71) Applicant: Sumitomo Wiring Systems, Ltd., Yokkaichi-shi, Mie (JP)

(72) Inventors: Aaron Steffka, Farmington Hills, MI (US); Nathan Like, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 4 days.

(21) Appl. No.: 15/862,555

(22) Filed: Jan. 4, 2018

(65) Prior Publication Data

US 2019/0202381 A1   Jul. 4, 2019

(51) Int. Cl.
| | | |
|---|---|---|
| H05K 5/02 | (2006.01) |
| B60R 16/023 | (2006.01) |
| H02B 1/46 | (2006.01) |
| H02G 3/08 | (2006.01) |
| H01R 9/22 | (2006.01) |
| H02G 3/16 | (2006.01) |
| H05K 1/14 | (2006.01) |
| H01R 13/518 | (2006.01) |
| H01R 13/627 | (2006.01) |

(52) U.S. Cl.
CPC ...... *B60R 16/0238* (2013.01); *B60R 16/0239* (2013.01); *H01R 9/226* (2013.01); *H02B 1/46* (2013.01); *H02G 3/081* (2013.01); *H02G 3/16* (2013.01); *H05K 1/144* (2013.01); *H01R 13/518* (2013.01); *H01R 13/6271* (2013.01); *H02G 3/088* (2013.01)

(58) Field of Classification Search
None
See application file for complete search history.

(56) References Cited

U.S. PATENT DOCUMENTS 5,845,734 A * 12/1998 Samardzich ......... B60K 5/1216
180/299
7,057,898 B2 * 6/2006 Chen ...................... G06F 1/184
312/223.1
7,848,088 B2 * 12/2010 Liu ......................... G06F 1/188
248/220.21

(Continued)

FOREIGN PATENT DOCUMENTS

| CN | 104590357 A | 5/2015 |
| CN | 103112414 B | 2/2016 |
| EP | 2432091 B1 | 8/2016 |

*Primary Examiner* — Courtney L Smith
(74) *Attorney, Agent, or Firm* — Honigman LLP

(57) ABSTRACT

A power distribution box includes a bottom cover having a lower surface. Disposed on the lower surface are a pair of axially offset feet. Each of the pair of feet has a first portion and a second portion spaced apart from the lower surface of the bottom cover so as to form an opening having a back wall. The second contact surface is spaced further apart from the lower surface relative to the first contact surface by a ramp portion so as to define the opening to be tapered. The opening is configured to receive a front edge of a bracket. Also disposed on the lower surface is a guide having a first portion that is angled relative to an insertion direction of the power distribution box to a bracket and a linear wall portion configured to slidably engage a side edge of the bracket.

17 Claims, 6 Drawing Sheets

(56) References Cited

U.S. PATENT DOCUMENTS

| | | | | |
|---|---|---|---|---|
| 8,199,499 | B2* | 6/2012 | Chen | G06F 1/188 |
| | | | | 312/223.1 |
| 9,606,577 | B2* | 3/2017 | Sullivan | G06F 1/16 |
| 10,096,978 | B2* | 10/2018 | Luoma | H02B 1/26 |
| 10,178,812 | B2* | 1/2019 | Tang | B64C 39/024 |
| 2005/0088813 | A1* | 4/2005 | Chen | G06F 1/184 |
| | | | | 361/679.01 |
| 2008/0310109 | A1* | 12/2008 | Park | H02M 7/003 |
| | | | | 361/697 |
| 2014/0196925 | A1* | 7/2014 | Kowtun | H02G 3/16 |
| | | | | 174/50 |
| 2015/0016028 | A1* | 1/2015 | Darr | H02G 3/10 |
| | | | | 361/626 |
| 2018/0310421 | A1* | 10/2018 | Kato | H05K 5/0204 |
| 2019/0031122 | A1* | 1/2019 | Chitaka | H05K 5/0073 |

* cited by examiner

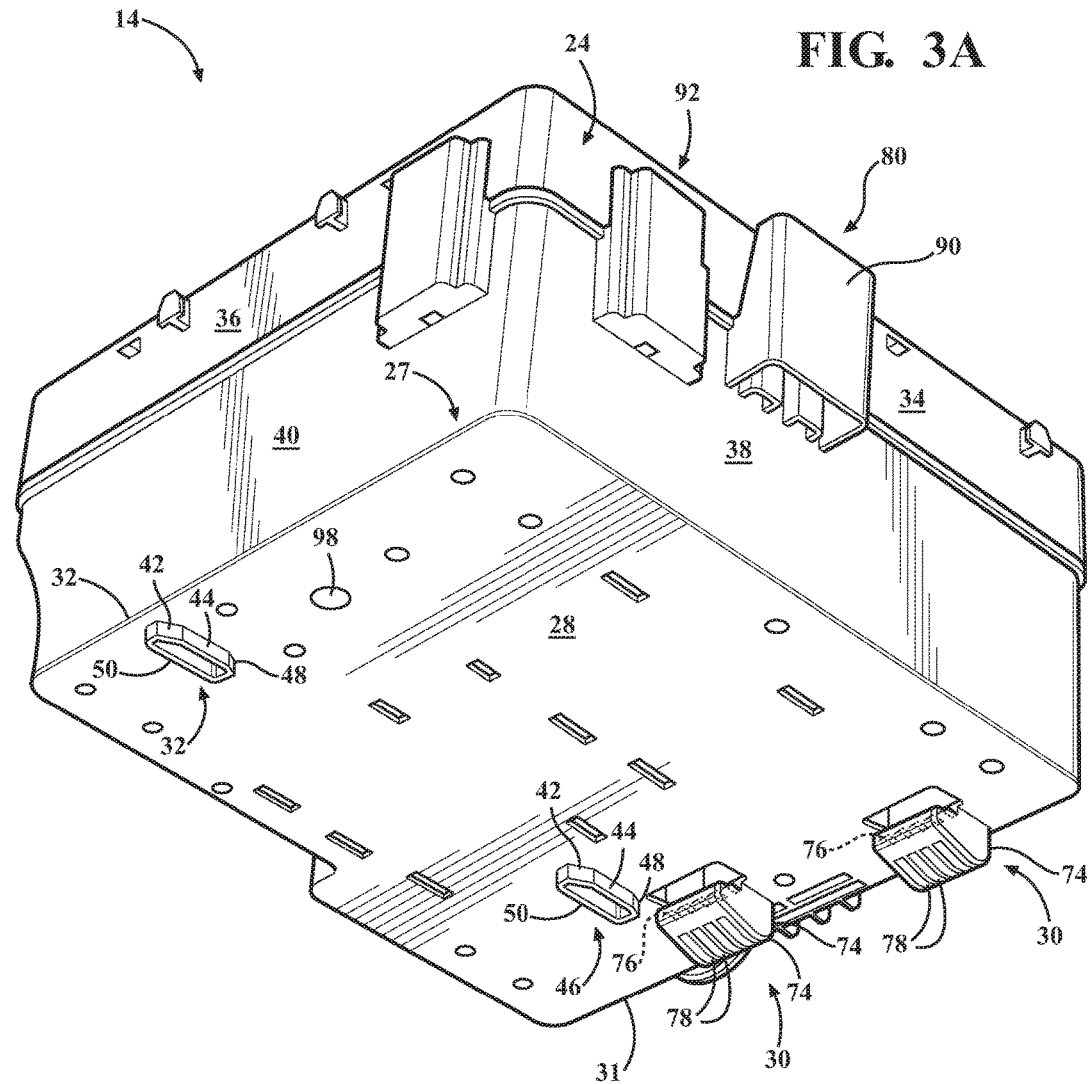

POWER DISTRIBUTION BOX ASSEMBLY WITH ALIGNMENT FEATURES

TECHNICAL FIELD

The present specification generally relates to power distribution box assemblies, and more particularly, to a power distribution box configured with alignment features to assist in a blind installation.

BACKGROUND

In general, power distribution boxes are installed onto a Power Distribution Box ("PDB") bracket. The PDB bracket is mounted within an engine compartment of an automobile. During the PDB installation process, an installer has to visually align and guide the PDB onto the PDB bracket while ensuring that the PDB is seated properly. However, with the increase in technological features that are offered to consumers, the engine compartment has become more crowded with the components required to power and/or drive the technological features, such as, additional wiring harnesses and electrical components.

As such, the PDB brackets are being installed into more compact places within the engine compartment; thus, PDBs are being forced to fit into more compact spaces. As a result, the installer has limited space to align and manually guide the PDB onto the PDB bracket. Further, the attachment of the PDB to the PDB bracket may be done in a blind installation. As used herein, the term blind installation refers to an installation process wherein the coupling of the attachment features are hidden from view. Further, any visual indicators alerting the installer that the PDB is seated onto the PDB bracket are significantly reduced and in many cases eliminated.

Accordingly, it is desirable to have a PDB configured with alignment and guiding features for a blind installation and confirm attachment of the PDB to the PDB bracket.

SUMMARY

In one embodiment, a PDB includes an upper cover and a bottom cover wherein the upper cover is configured to engage with the bottom cover. Further, the PDB includes a pair of feet mounted to a lower surface of the bottom cover adjacent to a first end. The pair of feet have a first portion and a second portion, the first portion and the second portion are spaced apart from the lower surface of the bottom cover so as to form an opening having a back wall. The back wall is orthogonal to the lower surface of the bottom cover.

The pair of feet has a first contact surface positioned adjacent to the back wall and a second contact surface positioned distally from the first contact surface and from the back wall. A ramp portion is disposed between and connects the first contact surface to the second contact surface so to have a taller opening of the second contact surface relative to the first contact surface. The pair of feet defines the opening so as to receive a front or leading edge of a bracket.

In one embodiment, the PDB includes a pair of guides. The pair of guides is disposed on the lower surface of the bottom cover of the PDB. The pair of guides has a first portion and a linear wall portion. The first portion is angled relative to an insertion direction of the PDB to a bracket. The linear wall portion is connected to the first portion and is disposed along an axis defined by the insertion direction of the PDB to the bracket. Further, the pair of guides may have a continuous wall so to be generally D-shaped. The pair of guides is axially aligned with one another along a length of the PDB. Accordingly, the first portion guides the PDB into a proper position for engagement with the PDB bracket and the linear wall maintains the proper position as the PDB is slid into engagement with the PDB bracket.

In yet another embodiment, the upper cover of the power distribution box has a first pair of opposing side walls and the bottom cover has a second pair of opposing sidewalls. The bottom cover is configured to engage with the upper cover. A plurality of resilient locking members is disposed on an outer surface of the second pair of opposing sidewalls. In one embodiment, the resilient locking members have a flange and a slot. A latch is disposed on an outer surface of the first pair of opposing sidewalls. The latch is configured to be seated within the slot so as to couple the upper cover to the bottom cover.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

FIG. 3A is an isolated perspective view of the power distribution box of FIG. 1, according to one or more embodiments described and illustrated herein;

DETAILED DESCRIPTION

Figure 1:
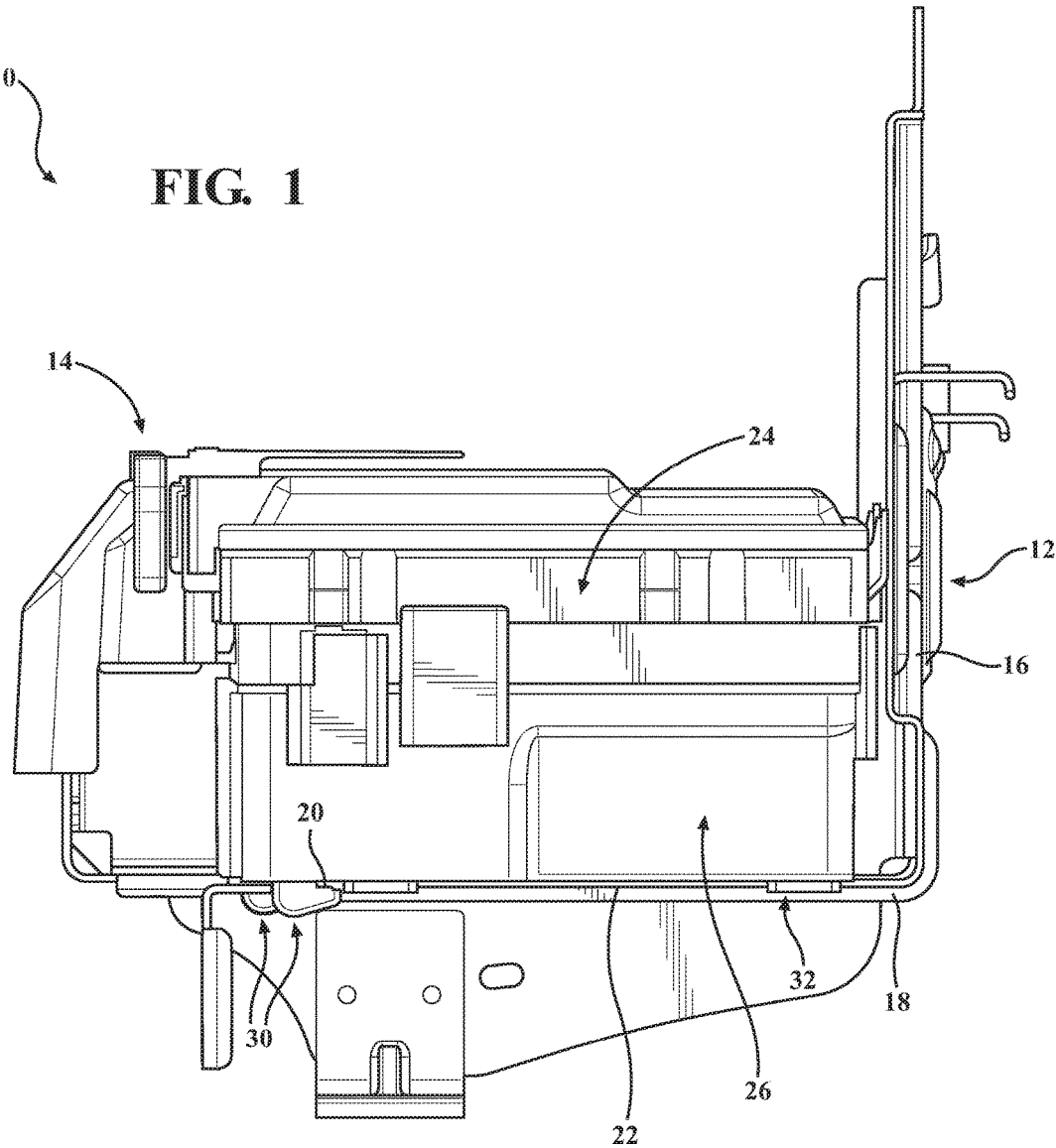
FIG. 1 schematically depicts an environmental view of a power distribution box installed onto a power distribution box bracket, according to one or more embodiments described and illustrated herein.

Figures and embodiments of the present disclosure include a power distribution box ("PDB") assembly having a PDB configured to facilitate a blind installation of the PDB and provide tactile confirmation that the PDB is properly seated onto a floor of a PDB bracket.

The PDB bracket is mounted to a support structure, such as the engine compartment of an automotive vehicle. The PDB bracket is a generally planar sheet of material. Due to manufacturing tolerances, the thickness of the PDB bracket may vary. Further, the PDB bracket may be positioned on a plane which is angled with respect to a lower surface of a bottom cover of the PDB. The bracket includes the floor and a rear wall orthogonal to the floor. The floor includes a front edge and a side edge. The side edge extends longitudinally along a PDB insertion direction.

The PDB includes an upper cover and the bottom cover The upper cover includes a first pair of opposing sidewalls and a first pair opposing end walls so to form a generally block shape member. The bottom cover includes a second pair of opposing sidewalls and a second pair of opposing end walls connected to each other so as to form the general shape of a box with an open bottom. The bottom cover includes the lower surface wherein a pair of feet is disposed on the lower surface and continuous with a first end wall of the bottom cover.

The pair of feet includes a first portion and a second portion. The first portion and the second portion are spaced apart from the lower surface of the bottom cover so as to form an opening having a back wall. The back wall is orthogonal to the lower surface of the bottom cover. The opening is configured to receive a front edge of the bracket floor. In particular, the pair of feet includes a first contact surface and a second contact surface. The first contact surface is contiguous with the back wall and the second contact surface is open to the opening. The first contact surface and the second contact surface are spaced apart from and directly opposite of the lower surface of the bottom cover.

The second contact surface is spaced further apart from the lower surface relative to the first contact surface. A ramp connects the second contact surface to the first contact surface so as to define the opening to be tapered. That is, the proximal end of the opening is wider than the distal end of the opening.

The front edge of the bracket is configured to be seated within the opening and abut the back wall of the pair of feet. Thus, it should be appreciated that the taper of the opening allows for the pair of feet to receive brackets with non-uniform, or of different thicknesses. Further, the wider opening allows for the receipt of brackets which are non-uniform in thickness.

Further, disposed on the lower surface of the bottom cover is a guide. The guide has a first portion and a linear portion. The first portion is angled in the in the insertion direction. The linear wall portion is configured to slidably engage with the side edge of the PDB bracket along the PDB insertion direction. The linear portion is connected to the first portion so to form a fulcrum. The first portion and the linear wall portion direct and assist in pivoting the PDB so that the linear wall portion is engaged with the side edge and the feet are aligned with the front edge of the PDB bracket. In one embodiment, there is a pair of guides, a forward guide and a rear guide. The pair of guides is axially aligned about a centerline.

The first portion and the linear wall portion direct the PDB into a proper alignment with the bracket so to allow for the PDB to be introduced onto the bracket floor at an angle relative to the bracket floor. That is, because of packaging considerations, obstacles, or the installer's position relative to the insertion direction, the PDB may have to be slid onto the floor of the PDB bracket at an angle. Further, these packaging spaces may require a blind installation of the PDB onto the PDB bracket; hence the installer would not be able to see whether the PDB is aligned on or angled with respect to the floor of the bracket.

The first portion and the linear wall portion would assist the installer allowing the PDB to be pivoted into a proper alignment where the linear wall portion would engage with the side edge of the PDB bracket. However, it is foreseeable that as the first portion of the rear guide is slid along the side edge of the PDB bracket during installation, the installer may pivot the PDB beyond the linear wall portion. That is, the installer may over correct for the angle upon installation and force the rear guide beyond the side edge of the PDB bracket. In this case, the forward guide would prevent the installer from overcorrecting the installation angle.

It should be appreciated that while the guides align the PDB with the bracket upon installation, the feet are configured to grab or engage with the front edge of the floor of the bracket so that when the bracket is slidably seated onto the bracket floor, the front edge of the bracket is fully engaged with the opening of the feet and fully seated within the feet and in particular resting on the first contact surface of the feet.

With reference to FIG. 1, a schematic depiction of a PDB assembly 10 in an environmental view is shown. The power distribution box assembly 10 includes a PDB bracket 12 and a PDB 14. The PDB 14 is slidably engaged onto PDB bracket 12. The PDB bracket 12 includes a back portion 16 and a floor portion 18. The floor portion 18 having a front edge 20 and a side edge 22. The side edge 22 is open so to allow the PDB 14 to slide onto the PDB bracket 12 from a forward position. It should be appreciated that the PDB bracket 12 may be attached to an engine compartment area of an automotive vehicle by any traditional means that those skilled in the art would appreciate and know. Further, it should be appreciated that the PDB bracket 12 and PDB 14 are not limited to the engine compartment area and thus may be installed anywhere within an automotive vehicle or any other platform which requires the use of a PDB.

Figure 2:
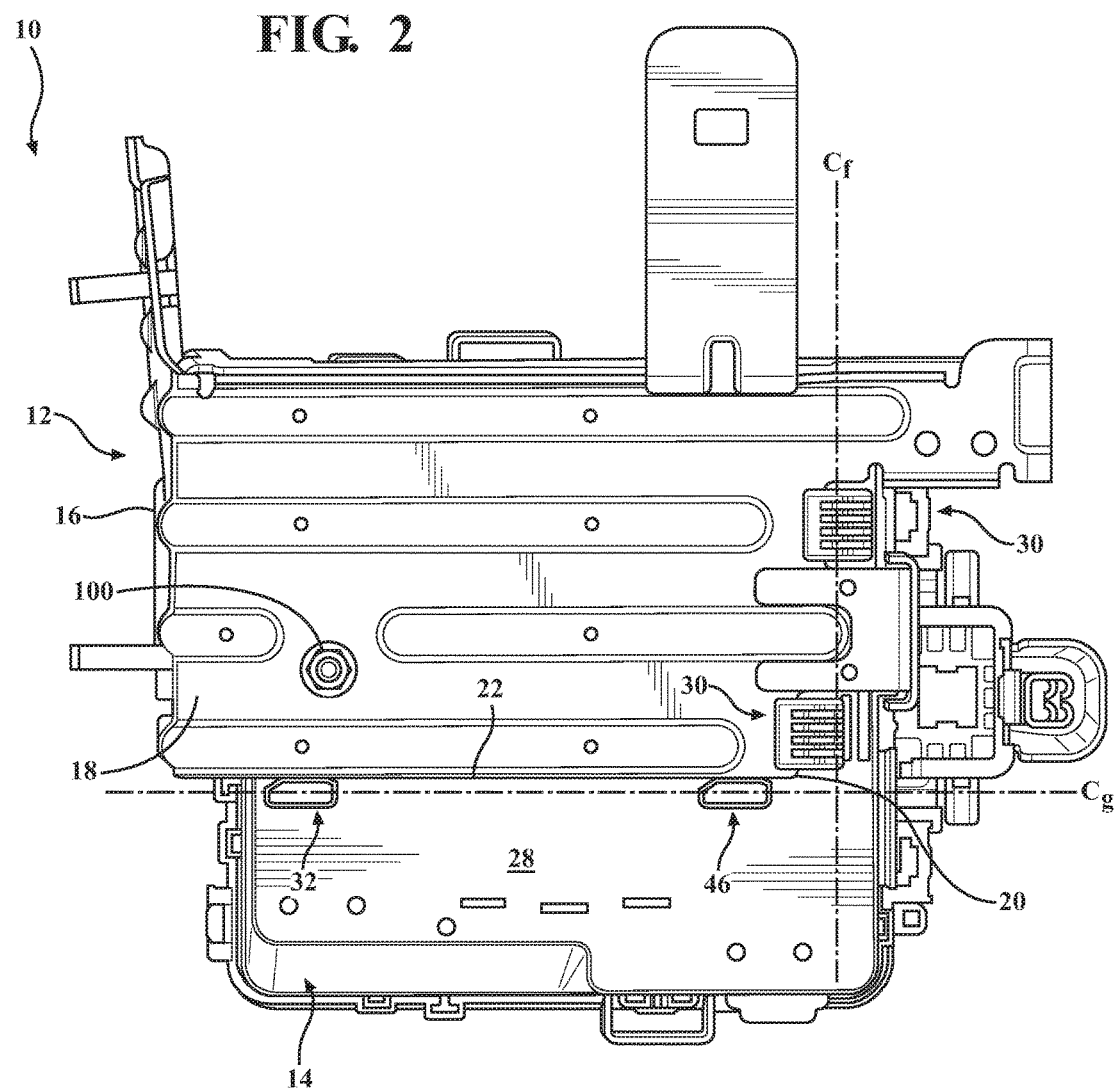
FIG. 2 is a bottom view of the power distribution box installed onto a power distribution box bracket as shown in FIG. 1, according to one or more embodiments described and illustrated herein.

With reference to FIGS. 1 and 2, the PDB 14 is schematically depicted as being fully seated onto the PDB bracket 12. The back portion 16 of the PDB bracket 12 is orthogonal to the floor portion 18 so to provide a stop for the PDB 14. However, it should be appreciated that the PDB 14 does not need to make contact with the back portion 16 to be fully seated onto the PDB bracket 12. The PDB 14 has an upper cover 24 and a bottom cover 26.

The bottom cover 26 has a lower surface 28. Extending from the lower surface 28 in a direction opposite of the upper cover 24 is a pair of feet 30 and a guide 32. The pair of feet 30 is axially offset from a center line Cf. The centerline Cf is perpendicular to the insertion direction. The feet 30 are configured to engage the front edge 20 of the floor portion 18 of the PDB bracket 12. The guide 32 is configured to abut the side edge 22 of the floor portion 18 and is aligned with the side edge 22 along the insertion direction 72 (shown in FIG. 4A). Therefore, the feet 30 and the guide 32 are positioned so to align and seat the PDB 14 onto the PDB bracket 12.

Figure 3B:
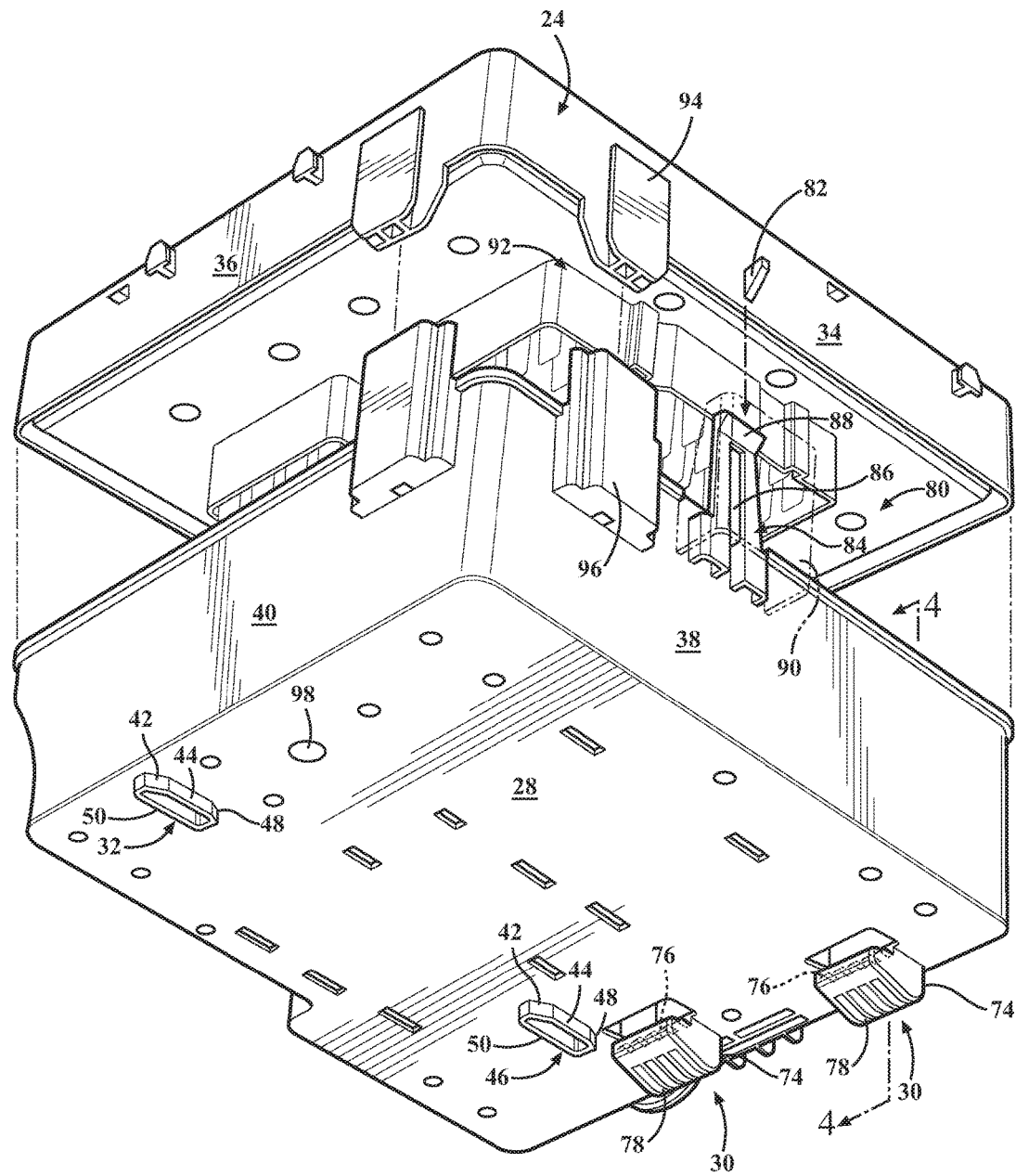
FIG. 3B is an isolated perspective view of the power distribution box of FIG. 3A showing an upper cover separated from a lower cover, according to one or more embodiments described and illustrated herein.

Now referring to FIGS. 3A-3B, an isolated perspective view of the PDB 14 is depicted. The upper cover 24 further includes a first pair of opposing sidewalls 34 and a first pair opposing end walls 36 so to form a generally block shape member. The bottom cover 26 further includes a second pair of opposing sidewalls 38 and a second pair of opposing end walls 40 connected to each other so as to form the general shape of a box with an open bottom. The upper cover 24 and the bottom cover 26 are configured to couple to one another through a retention assembly 80 (shown in FIG. 3B) that will be described below.

The guide 32 is disposed on the lower surface 28 of the bottom cover 26. The guide 32 includes a first portion 42 and a linear wall portion 44. The first portion 42 is angled in the in the insertion direction 72 (shown in FIG. 4A). The first portion 42 and the linear wall portion 44 are configured to slidably engage with the side edge 22 of the PDB bracket 12 along the PDB 14 insertion direction 72 (shown in FIG. 4A). In a preferred embodiment, the first portion 42 and the linear wall portion 44 have a height equal to or greater than a thickness of the side edge 22 of the floor 18 of the PDB bracket 12. The linear wall portion 44 is connected to the first portion 42 so as to form a fulcrum. The first portion 42 and the linear wall portion 44 direct the PDB 14 so that the linear wall portion 44 is engaged with the side edge 22 and the pair of feet 30 are aligned with the front edge 20 of the PDB bracket 12. Further, the first portion 42 and the linear wall portion 44 assist in pivoting the PDB 14 so to align the linear wall portion 44 with the side edge 22 of the floor 18 of the PDB bracket 12. In one embodiment, the guide 32 is a pair of guides, a forward guide 46 and a rear guide 32. The pair of guides 32, 46 is configured to abut the side edge 22 of the floor portion 18 and is axially aligned with each other along center line Cg (shown in FIG. 2). The centerline Cg is parallel to the insertion direction 72 (shown in FIG. 4A).

The first portion 42 and the linear wall portion 44 direct the PDB 14 into a proper alignment with the PDB bracket 12 so to allow for the PDB 14 to be introduced onto the floor 16 of the PDB bracket 12 at an angle relative to the floor 16. That is, because of packaging considerations, obstacles, or the installer's position relative to the insertion direction, the PDB 14 may have to be slid onto the floor 16 of the PDB bracket 12 at an angle. Further, these packaging spaces may require a blind installation of the PDB 14 onto the PDB bracket 12; hence, the installer would not be able to see whether the PDB 14 is aligned on or angled with respect to the floor 16 of the PDB bracket 12.

The first portion 42 and the linear wall portion 44 would assist the installer allowing the PDB 14 to be pivoted into a proper alignment where the linear wall portion 44 would engage with the side edge 22 of the PDB bracket 12. However, it is foreseeable that, during installation, as the first portion 42 of the rear guide 32 is slid along the side edge 22 of the PDB bracket 12, the installer may pivot the PDB 14 beyond the linear wall portion 44. That is, the installer may over correct for the angle upon installation and force the rear guide 32 beyond the side edge 22 of the PDB bracket 12. In this case, the forward guide 46 would prevent the installer from overcorrecting the installation angle. The linear wall 44 of the forward guide 46 slidably engages with the side edge 22 of the PDB bracket 12 thus preventing the PDB 14 from pivoting beyond the side edge 22.

In alternative embodiments, the guide 32 or the pair of guides 32, 46 may have a second portion 48 oppositely angled from the first portion 42 and a back wall portion 50 so to form a generally D-shape guide. The addition of the back wall portion 50 provides additional strength and rigidity to the first portion 42 and the linear wall portion 44 of the guides 32, 46.

Figure 4A:
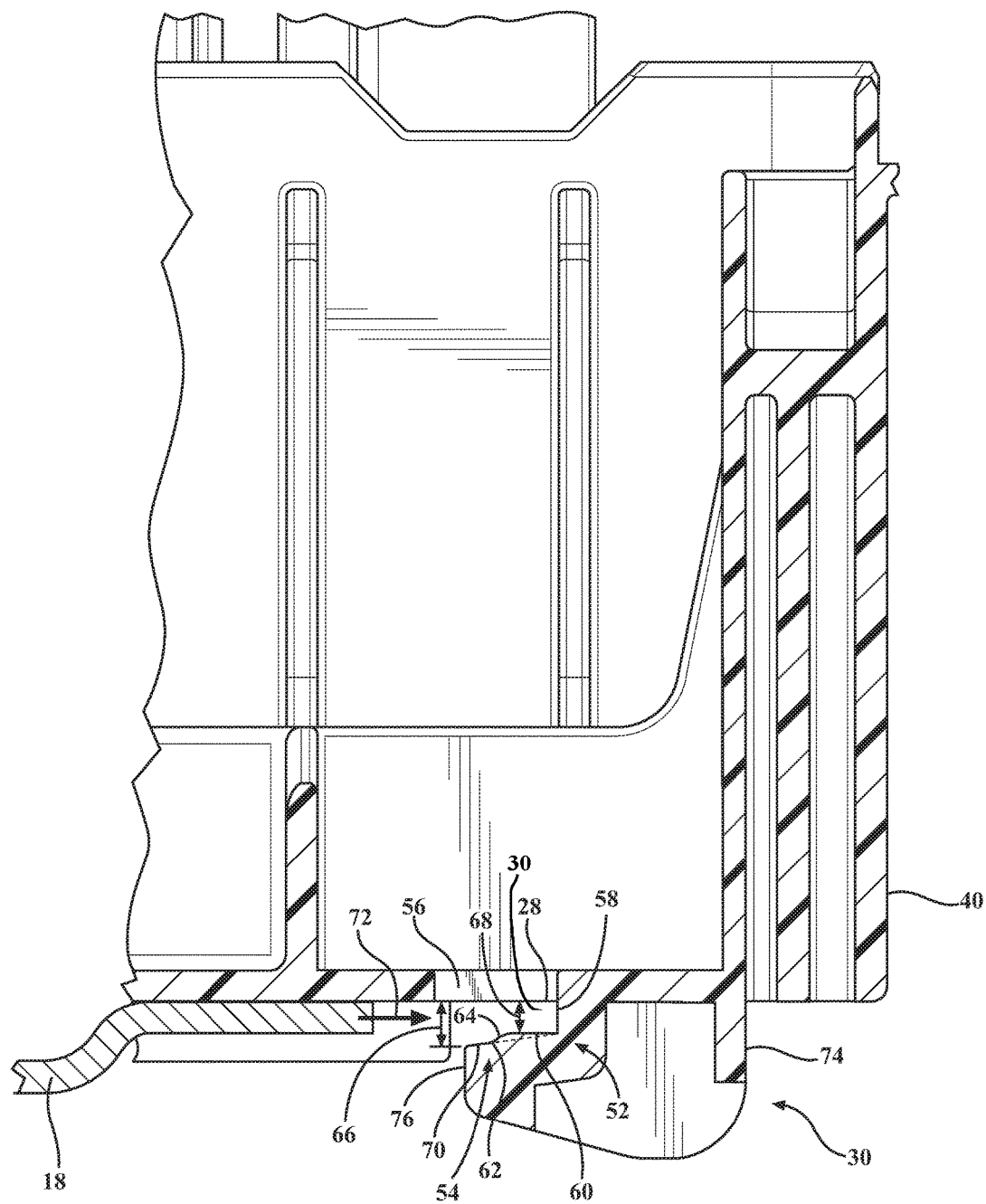
FIG. 4A is a cross sectional view of the power distribution box shown in FIG. 3A taken along lines 4-4 before the bracket is introduced into the pair of feet, according to one or more embodiments described and illustrated herein.
Figure 4B:
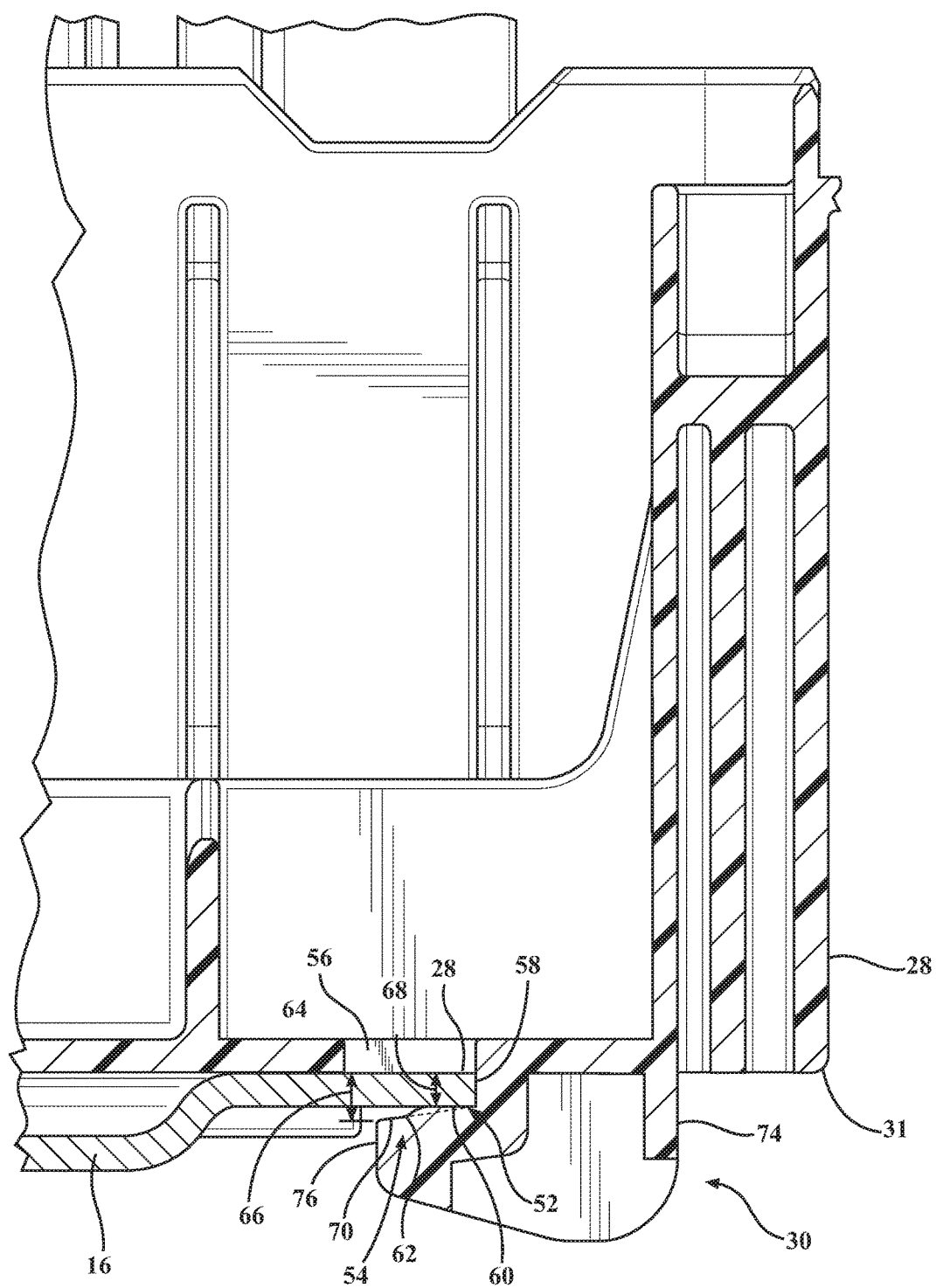
FIG. 4B is a cross sectional view of the power distribution box shown in FIG. 3A taken along lines 4-4 with the bracket seated within the pair of feet, according to one or more embodiments described and illustrated herein.

Now referring to FIGS. 4A-4B, a schematic depiction of a cross sectional of the PDB 14 taken from line 4-4 in FIG. 3A will be described here. While only one foot of the pair of feet 30 is shown, it should be appreciated that, in this embodiment, the feet 30 are identical to each other. The pair of feet 30 is axially offset from a centerline Cf (shown in FIG. 2). It should also be appreciated that in other embodiments, the feet 30 may be axially aligned with respect to the centerline Cf.

Each of the pair of feet 30 has a first portion 52 and a second portion 54, the first portion 52 and the second portion 54 are spaced apart from the lower surface 28 of the bottom cover 26 so as to form an opening 56 having a back wall 58. The back wall 58 is orthogonal to the lower surface 28 of the bottom cover 26. The opening 56 is configured to receive the front edge 20 of the floor 18.

In particular, each of the pair of feet 30 has a first contact surface 60 within the first portion 52 and a second contact surface 62 within the second portion 54. The first contact surface 60 is contiguous with the back wall 58 and the second contact surface 54 is open to the opening 56. The first contact surface 60 and the second contact surface 62 are spaced apart from and directly opposite of the lower surface 28 of the bottom cover 26.

The second contact surface 62 is spaced further apart from the lower surface 28 relative to the first contact surface 60. A ramp 64 connects the second contact surface 62 to the first contact surface 60 so as to define the opening 56 to be tapered. That is, the proximal end 66 of the opening 56 is wider than the distal end 68 of the opening 56.

The pair of feet 30 defines the opening 56 so as to receive the leading edge or the front edge 20 of the PDB bracket 12. The ramp portion 64 is a cam surface so to introduce the front edge 20 of the PDB bracket 12 into the distal end 68 of the opening 56 of first contact surface 60 so to fully seat the bracket 12. In the fully seated position, the front edge 20 of the PDB bracket 12 is in a pinch fit engagement with the first contact surface 60 and the lower surface 28 of the bottom cover 26.

In an alternative embodiment, a plurality of ribs 70 is formed on the second contact surface 62. The ribs 70 extend a length defined by the axial depth of the feet 30 and extend beyond the second contact surface 62. The ribs 70 are configured to make contact with the front edge 20 of the PDB bracket 12, when the front edge 20 is non-uniform. For example, not all PDB brackets 12 have a uniform thickness or a uniform planar sheet of material so the front edge 20 may not fit into the pinch fit engagement of the first contact surface 60. In these instances, the rib 70 will assist in any non-uniform positioning of the front edge 20 to hold the PDB bracket 12 within the feet 30.

It should be appreciated that while the guide 32 aligns the PDB 14 with the PDB bracket 12 upon installation, the feet 30 are configured to grab or engage with the front edge 20 of the floor 18 of the PDB bracket 12 so that when the PDB 14 is slidably seated onto the floor 18 of the PDB bracket 12, the front edge 20 of the PDB bracket 12 is fully engaged with the opening 56 of the feet 30 and fully seated within the feet 30 and in particular resting on the first contact surface 60 of the feet 30.

Now referring back to FIGS. 3A, 3B, 4A and 4B, it should be appreciated that the outer contours of the feet 30 may be dimensioned to account for packaging restraints. For illustrative purposes, the feet 30 are shown as having a rounded back end 74 that tapers to a front lip 76 that defines the opening 56. However, it should be appreciated the embodiments shown herein are provided for illustrative purposes and is not limiting to the scope of the claims.

In one embodiment, as shown in FIGS. 3A-3B, the feet 30 further include a plurality of recesses 78. The recesses 78 are disposed along the length of the feet 30 and may longitudinally extend between the rounded back end 74 and the front lip 76. The recesses 78 provide for greater expansion of the feet 30.

With reference to FIG. 3B, the upper cover 24 is schematically depicted as being separated from the bottom cover 26. The upper cover 24 and the bottom cover 26 are configured to be releasably coupled to one another through the retention assembly 80. The retention assembly 80 includes at least one latch 82 and at least one resilient locking leg 84. The at least one latch 82 is disposed on the first pair of opposing sidewalls 34 of the upper cover 24. The at least one resilient locking leg 70 is disposed on the on the second pair of opposing sidewalls 38. The resilient locking leg 84 is generally U-shaped so as to define a slot 86 having a closed bottom flange 88. The slot 86 is configured to receive the latch 82. The bottom cover 27 further includes a channel 90 disposed on the pair of opposing sidewalls 38. The channel 90 extends vertically beyond an upper edge of the pair of opposing sidewalls 38 and is configured to cover the at least one resilient locking leg 84 and the latch 82 when the upper cover 24 is fully seated onto the bottom cover 26.

The at least one resilient locking leg 84 deflects outwardly so to receive the latch 82. The at least one resilient locking leg 84 closes when the latch 82 is seated within the slot 86 so as to releasably couple the upper cover 24 to the bottom cover 26.

In another embodiment, the PDB bracket 12 may have a first sidewall (not illustrated) opposite the open end. The first sidewall may have notches configured to engage the asymmetrical features of the PDB 14, such as, the retention assembly 80 and a cover alignment assembly 92. The cover alignment assembly 92 includes a tapered finger 94 and a tapered cavity 96 where the tapered cavity 96 is configured to receive the tapered finger 94 in a pinch fit engagement. The asymmetrical features of the PDB 14 are seated within the notches. The first sidewall may assist in preventing lateral, vertical, and/or horizontal movement of the PDB 14. In another non-limiting example, the notches may be configured to accommodate the asymmetrical features of the PDB 14 so as to minimize the packaging space of the PDB assembly 10.

With reference to FIGS. 1-4B, the PDB 14 may be guided on to the PDB bracket 12 with the PDB 14 orientated in such a way that the guide 32 slidably engages the open side edge 22 of the PDB bracket 12. Since the first portion 42 is angled with respect to the direction of insertion, the PDB 14 is lead in a linear fashion with respect to the floor portion 18 of the PDB bracket 12 into a proper seating position for engagement with the feet 30.

As the installer pushes the PDB 14 into its final position, the front edge 20 of the PDB bracket 12 is introduced into the opening 56. The second portion 54 of the opening 56 is wider than the first portion 52 so to allow for tolerance and to the vertical plane. For example, the PDB box bracket 12 does not have to be precisely introduced in order to achieve the proper pinch fit engagement.

Further, the linear portion 46 of the guide 32 maintains abutment of the side edge 22 so to prevent the PDB 14 from lateral movements towards the open end of the PDB bracket 12.

In another embodiment, once the front edge 20 of the PDB bracket 12 is fully seated into the feet 30, a bore 98 in the PDB 14 aligns with a through hole 100 (shown in FIG. 2) in the PDB bracket 12. The through hole 100 may be a slot or another non-circular shape. Further, the lower surface 28 of the PDB 14 may have a raised ring surrounding the bore 98.

The raised ring is configured to engage with the inner walls of the slot or non-circular through hole 100 of the PDB bracket 12. The raised ring and slot engagement further prevents movement in the horizontal and lateral directions and may serve as another indicator to an installer that the PDB 14 is seated. That is, the ring may give a visual indicator, a noise indicator, or a touch indicator to the installer that the PDB 14 is seated onto the PDB bracket 12. Further, if a fastener is used, as the fastener passes through the bore 98 of the PDB 14 and through the hole 100 of the PDB bracket 12, the installer is ensured that the PDB 14 is fully seated onto the PDB bracket 12.

While particular embodiments have been illustrated in described herein it should be understood that various other changes and modifications may be made without departing from the spirit and scope of the claim subject matter. Moreover, although various aspects of the claim subject matter have been described herein, such aspects may not be utilized in combination. It is therefore intended that the appended claims cover all such changes and modifications there within the scope of the claims subject matter.

What is claimed is:

1. A power distribution box comprising:
an upper cover;
a bottom cover configured to engage the upper cover; and
a pair of feet mounted to a lower surface of the bottom cover adjacent to a first end wall, the pair of feet having a first portion having a first contact surface and a second portion having a second contact surface, the first portion and the second portion are spaced apart from the lower surface of the bottom cover so as to form an opening having a back wall, the back wall is orthogonal to the lower surface of the bottom cover, wherein the second contact surface is spaced further apart from the lower surface relative to the first contact surface so as to define a tapered opening and a ramp portion connects the second contact surface to the first contact surface, the ramp portion is a cam so as to introduce the front edge of the bracket into the opening of the first contact surface.

2. The power distribution box of claim 1, wherein the pair of feet are axially offset from one another with respect to a centerline.

3. The power distribution box of claim 1, further comprising: a guide disposed on the lower surface of the bottom cover, the guide has a first portion and a linear wall portion, the first portion is angled relative to an insertion direction.

4. The power distribution box of claim 1, further comprising: a pair of guides disposed on the lower surface of the bottom cover, the pair of guides having a first portion and a linear wall portion, the first portion is angled relative to an insertion direction.

5. The power distribution box of claim 4, wherein the pair of guides are axially aligned with one another with respect to an insertion direction.

6. The power distribution box of claim 3, wherein the linear wall portion of the guide is connected to the first portion, the linear wall portion is disposed along an axis defined by the insertion direction of the power distribution box onto the bracket, the linear wall portion slidably engages with a side edge of a bracket during installation.

7. The power distribution box of claim 4, wherein the linear wall portion of the pair of guides is connected to the first portion, the linear wall portion is disposed along an axis defined by the insertion direction of the power distribution box onto the bracket, the linear wall portion slidably engages with a side edge of a bracket during installation.

8. The power distribution box of claim 1, wherein the second contact surface further includes a plurality of ribs, the plurality of ribs extend on a length defined by an axial depth of the feet and the plurality of ribs extend beyond the second contact surface.

9. A power distribution box assembly comprising:
a bracket having a back portion and a floor portion, the floor portion having a front edge and a side edge;
a power distribution box having an upper cover and a bottom cover, the bottom cover having an upper surface and a lower surface, the upper surface configured to engage the upper cover, the lower surface configured to engage with the floor portion of the bracket;

a pair of feet mounted to the lower surface of the bottom cover adjacent to a first end wall, the pair of feet having a first portion having a first contact surface and a second portion having a second contact surface, the first portion and the second portion are spaced apart from the lower surface of the bottom cover so as to form an opening having a back wall, the back wall is orthogonal to the lower surface of the bottom cover, and a ramp portion connects the second contact surface to the first contact surface, the ramp portion is a cam so as to introduce the front edge of the bracket into the opening of the first contact surface.

10. The power distribution box assembly of claim 9, wherein the second contact surface is spaced further apart from the lower surface relative to the first contact surface so as to define a tapered opening.

11. The power distribution box assembly of claim 9, wherein the pair of feet are axially offset from one another with respect to a centerline.

12. The power distribution box of claim 9, further comprising:

a guide disposed on the lower surface of the bottom cover, the guide has a first portion and a linear wall portion, the first portion is angled relative to an insertion direction.

13. The power distribution box assembly of claim 9, further comprising: a pair of guides disposed on the lower surface of the bottom cover, the pair of guides having a first portion and a linear wall portion, the first portion is angled relative to an insertion direction of the power distribution box onto the bracket floor.

14. The power distribution box assembly of claim 13, wherein the pair of guides are axially aligned with one another with respect to an insertion direction.

15. The power distribution box of claim 12, wherein the linear wall portion of the guide slidably engage with the side edge of a bracket during installation and maintain contact with the bracket floor is fully seated.

16. The power distribution box of claim 9, wherein the second contact surface further includes a plurality of ribs, the plurality of ribs extend on a length defined by an axial depth of the feet and the plurality of ribs extend beyond the second contact surface.

17. A power distribution box assembly comprising:

a bracket having a black portion and a floor portion, the floor portion having a front edge and a side edge;

an upper cover;

a bottom cover configured to engage the upper cover;

a pair of feet mounted to the lower surface of the bottom cover adjacent to a first end wall, the pair of feet having a first portion having a first contact surface and a second portion having a second contact surface, the first portion and the second portion are spaced apart from the lower surface of the bottom cover so as to form an opening having a back wall, the back wall is orthogonal to the lower surface of the bottom cover;

a guide disposed on the lower surface of the bottom cover, the guide having a first portion and a linear wall portion, the first portion is angled relative to an insertion direction, the linear wall portion is connected to the first portion and is disposed along an axis defined by the insertion direction of the power distribution box to the bracket, the linear wall portion slidably engages with the side edge of the bracket during installation so as to seat the front edge of the bracket into the opening and against the back wall of the pair of feet.

\* \* \* \* \*